United States Patent [19]

Vandegraaf

[11] Patent Number: 4,866,404

[45] Date of Patent: Sep. 12, 1989

[54] PHASE LOCKED FREQUENCY SYNTHESIZER WITH SINGLE INPUT WIDEBAND MODULATION SYSTEM

[75] Inventor: Johannes J. Vandegraaf, Lynchburg, Va.

[73] Assignee: General Electric Company, Lynchburg, Va.

[21] Appl. No.: 244,498

[22] Filed: Sep. 15, 1988

[51] Int. Cl.[4] .................................. H03C 3/00
[52] U.S. Cl. ...................... 332/127; 331/23; 455/113
[58] Field of Search ............ 332/18, 19; 331/23; 455/42, 110, 112, 113; 375/44

[56] References Cited

U.S. PATENT DOCUMENTS

| | | |
|---|---|---|
| 4,052,672 | 10/1977 | Enderby et al. . |
| 4,117,422 | 9/1978 | Hunt . |
| 4,140,981 | 2/1979 | Bergman . |
| 4,189,689 | 2/1980 | Triplett . |
| 4,242,649 | 12/1980 | Washburn, Jr. . |
| 4,313,209 | 1/1982 | Drucker . |
| 4,409,563 | 10/1983 | Vandegraaf ................ 332/19 X |
| 4,503,402 | 3/1985 | Englund, Jr. . |
| 4,510,465 | 4/1985 | Rice et al. . |
| 4,554,517 | 11/1985 | Parniere et al. . |
| 4,581,749 | 4/1986 | Carney et al. ............... 332/19 X |

FOREIGN PATENT DOCUMENTS 57-103412 6/1982 Japan .

Primary Examiner—Eugene R. LaRoche
Assistant Examiner—Robert J. Pascal
Attorney, Agent, or Firm—Nixon & Vanderhye

[57] ABSTRACT

A single input wideband modulation system for a phase locked loop is achieved by interposing the inverse analogue of the closed phase locked loop transfer function between the modulation source and the VCO modulation input. A first branch of the interposed circuit directly passes high frequency signals from the modulation source to a summing device tied to an input of the VCO. A second branch of the interposed circuit boosts low frequency signals and blocks high frequency signals recieved from the modulation source and passes such signal to the summing device where signals from the first and second branches are summed to permit wideband modulation of the VCO. All the modulation processing is performed outside the phase locked loop.

29 Claims, 4 Drawing Sheets

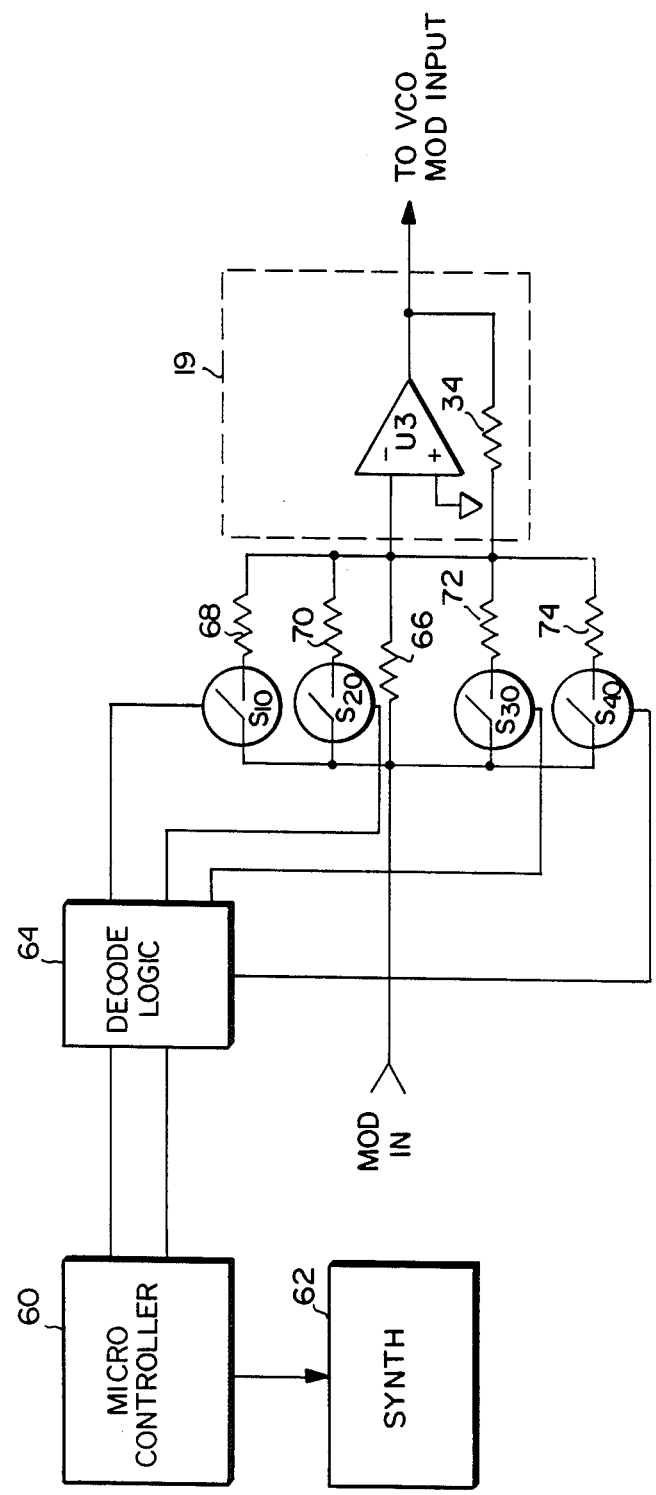

PHASE LOCKED FREQUENCY SYNTHESIZER WITH SINGLE INPUT WIDEBAND MODULATION SYSTEM

FIELD OF THE INVENTION

This invention relates to phase locked loop frequency synthesizers. More particularly, the invention relates to a method and apparatus for modulating phase locked loops so as to substantially extend the frequency range of modulation.

BACKGROUND AND SUMMARY OF THE INVENTION

Current practice in mobile radio transceivers is to derive the operating frequencies with phase locked loop synthesizers. In such a synthesizer, a phase locked loop circuit controls a variable frequency oscillator, i.e., a voltage controlled oscillator (VCO), to lock in at the frequency and phase angle of a standard reference frequency. In this fashion, the VCO will have the same accuracy as the standard. The phase locked loop operates to track the operation of the reference oscillator.

In general, a phase locked loop includes a VCO, a reference oscillator, a phase detector and a loop filter. The phase detector compares the phase of the VCO output signal with the phase of the signal from the reference oscillator. The phase detector generates an output signal related to the difference between the two compared signals. This output signal is processed by a low pass filter and is then applied as a control signal to an input terminal of the VCO to control the frequency of the oscillator output signal.

Modulation of the VCO output signal has heretofor typically been accomplished by applying a modulation signal to either the reference oscillator, the VCO or to both the reference oscillator and the VCO. If the reference oscillator is modulated, the modulation response of the phase locked loop has a transfer function which is relatively flat for low frequencies up to approximately the natural resonant frequency of the phase locked loop. The transfer function, however, decreases rapidly at approximately the natural frequency of the phase locked loop. It is therefore generally impractical to use this method of modulation for frequencies greater than the natural frequency of the loop because of the rapidly decreasing loop response at such frequencies.

Such a method is not a satisfactory approach for frequency modulating a VCO in typical FM transmitter applications due to the lack of a high frequency response. The phase locked loop behaves as a low pass filter with respect to modulation applied to the reference oscillator. The ability of the VCO output to track the reference source frequency is limited by the effective loop gain of the feedback control loop.

Alternatively, if the VCO is modulated directly, then the loop behaves as a high pass filter with respect to applied modulation. The modulation response while relatively flat for higher frequencies decreases rapidly for low frequencies, thereby exhibiting a less than satisfactory modulation response characteristic.

In order to achieve wideband modulation, one approach that has been employed is to modulate both the VCO and the reference oscillator in a complementary fashion. In this regard, by modulating both the reference source and the VCO in the proper ratio, a flat modulation response, i.e., a constant modulation level over a wide frequency band, can be obtained.

The viability of a particular method of modulating a phase locked loop is highly application dependent. In this regard, if the phase locked loop bandwidth is large, when compared with the modulation input, then the reference oscillator should be modulated. If it is desirable to handle the audio spectrum which ranges from 200 Hz to 4 KHz, and if the phase locked loop is able to track to 1 KHz, then the loop will track up to the 1 KHz level and then be unable to satisfactorily track frequencies above 1 KHz. Under such circumstances, it may be possible to modulate the reference oscillator to achieve satisfactory operation.

On the other hand, if the phase locked loop only has a tracking bandwidth of 100 Hz, then the reference oscillator can not be modulated to achieve satisfactory system operation. Thus, based on the limitations of a particular system in a given application context, modulation of the reference oscillator, the VCO or both may be in order.

In many applications, it is undesirable or impossible to modulate the reference source. In this regard, it is often desirable to make the reference oscillator more rock solid stable with respect to its major intended purpose—namely, accurately defining a reference frequency onto which the phase locked loop can lock. This increased stability requirement is inherently inconsistent with an ability to readily modulate or change the frequency of the reference oscillator.

In other applications, the reference frequency source may be a frequency standard which is not accessible. Thus, in such a system which does not include a reference oscillator, it is impossible to modulate the reference source.

The present invention is a single input system which creates a flat frequency response down to very low frequencies and permits wideband modulation of the VCO. In contrast to many prior art attempts to provide wideband modulation of the phase locked loop, the present invention does not require separate inputs at different points in the control loop. Instead, a modulation input port to the VCO is the only modulation input that needs to be used.

In the present invention, wideband modulation of the VCO is achieved by interposing the inverse analogue of the closed phase locked loop transfer function between the modulation source and the VCO modulation input. A first branch of the interposed circuit directly passes high frequency signals from the modulation source to a summing device tied to the input of the VCO. A second branch of the interposed circuit boosts low frequency signals and blocks high frequency signals received from the modulation source and passes such signals to the summing device where signals from the first and second branches are summed to permit wideband modulation of the VCO. All the modulation processing is performed outside the phase locked loop.

BRIEF DESCRIPTION OF THE DRAWINGS

These as well as other objects and advantages of the present invention will be better appreciated by reading the following detailed description of the presently preferred exemplary embodiment of the present invention taking in conjunction with the accompanying drawings of which:

FIGS. 4, 5 and 6 are exemplary variable gain networks which may be used to implement elements 20 and 32 shown in FIG. 2;

DETAILED DESCRIPTION OF THE DRAWINGS

Figure 1:
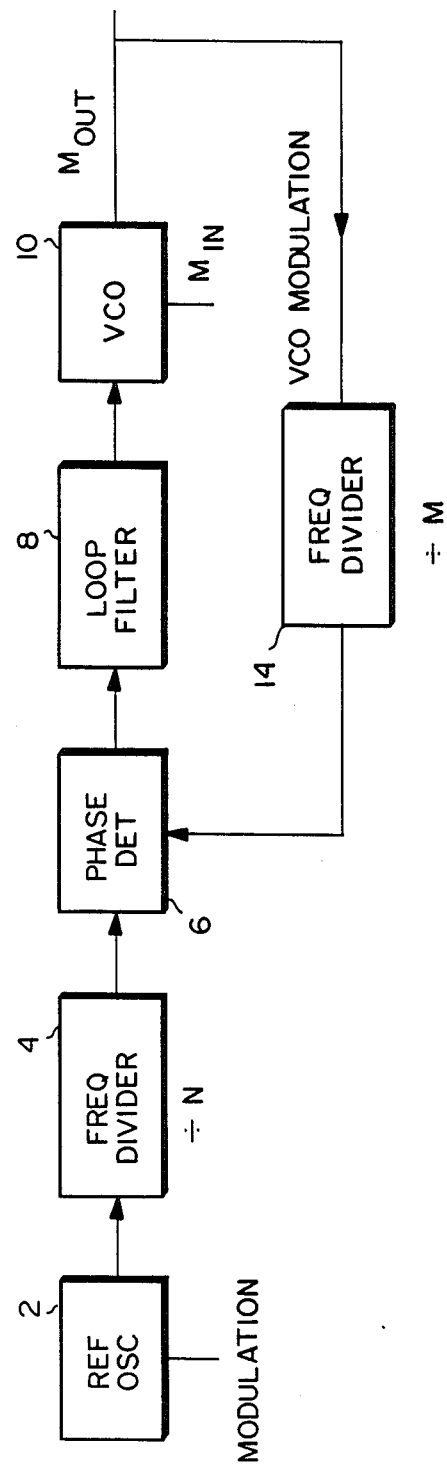
FIG. 1 is a schematic block diagram of a conventional phase locked loop synthesizer.

FIG. 1 shows a conventional phase locked loop synthesizer. Since this phase locked loop synthesizer is conventional, it is only generally described below. As noted above, in mobile radio transceivers operating frequencies are typically derived using such a phase locked loop synthesizer.

The purpose of the phase locked loop circuit shown in FIG. 1 is to control the variable frequency voltage-controlled oscillator (VCO 10) to lock in at the frequency standard or reference frequency. In FIG. 1, the standard frequency is provided by reference oscillator 2.

VCO 10 may be any of a number of conventional voltage controlled oscillators. Such an oscillator typically uses a semiconductor capacitive diode, i.e., a varactor, whose capacitance varies with the amount of reverse voltage. When such a capacitive diode is placed across an inductor in the oscillator's tuned circuit, the oscillator frequency may be varied by controlling the DC voltage across the diode.

The reference frequency generated by reference oscillator 2, after being divided down by frequency divider 4, is input to a phase detector 6. The phase detector 6 compares the reference oscillator frequency (divided by N, the frequency divider 4 division ratio) with the frequency output (divided by M, the frequency divider 14 division ratio) from the VCO 10 which is fed back to the phase detector 6 via frequency divider 14.

Any difference in phase between the two signals input to phase detector 6 results in an error signal that indicates how much the voltage controlled oscillator differs from the standard. The phase detector 6, for example, may include two diodes in a balanced rectifier circuit. The amount of rectified DC output depends on the difference in phase between the two input frequencies received from frequency divider 4 and frequency divider 14.

The error signal generated by phase detector 6 is input to loop filter 8. Loop filter 8 is typically a low pass filter which may, for example, be an RC circuit that removes AC signal variations of the two oscillators from the rectified DC output of the phase detector 6. The input to the filter is the DC error signal with an AC ripple. The output is a filtered DC control voltage which is amplified to increase the amount of DC control voltage for achieving better control of the VCO 10. The amplified output signal provides the desired DC level for the control voltage in the polarity needed for the varactor in the VCO.

As indicated above, in the present invention an inverse analogue of the closed loop transfer function is interposed between the modulation source and a VCO modulation input in order to permit wideband modulation of the VCO. It is noted that a transfer function is the ratio of a predetermined output divided by a related input which mathematically expresses how the two signals are related.

For example, if the reference oscillator 2 shown in FIG. 1 is to be modulated, a transfer function may be defined which is the modulation output of the VCO divided by the modulation input to the reference oscillator. This transfer function exhibits a low pass characteristic since the phase locked loop behaves as a low pass filter with respect to modulation applied to the reference oscillator. Thus a plot of the magnitude of the ratios of the VCO modulation output to the reference modulation input both as to amplitude phase angle defines a transfer function exhibiting a low pass frequency response. Since the closed loop bandwidth is generally in the range of 10 Hz to 500 Hz, applying modulation to the reference oscillator is not a satisfactory method for frequency modulating the VCO due to a lack of high frequency response.

In the present invention, a flat modulation response is achieved in a single modulation input system using circuitry which is the inverse analogue of the closed loop transfer function of the feedback system with respect to frequency modulation of the VCO. It can be shown that the closed loop transfer function defined by the modulation out divided by modulation in of the VCO 10 shown in FIG. 1, is a high pass transfer function. Thus, in the present invention, a flat modulation response is achieved without applying modulation to the reference oscillator 2 shown in FIG. 1, but rather only to a single modulation input of the VCO 10.

The closed loop transfer function of the feedback system, with respect to frequency modulation in the VCO, shows the inherent high pass character of the loop response. In this regard, the response asymptomatically approaches $K_{VCO}$, the gain constant of the VCO, at high frequencies with a pole at zero frequency to produce a 6 db/octave low frequency cut-off. This response is modified by the loop filter response which is typically of the lag type.

In accordance with the present invention, a network having a transfer function $K_s$ is interposed between a modulation source and an input to the VCO. The interposed network synthesizes the transfer function such that the product of the closed loop transfer function of the phase locked loop system with respect to frequency modulation of the VCO 10, multiplied by the transfer function of the interposed network is equal to a constant. In this fashion, using only a single modulation input, a flat frequency response is achieved.

Figure 2:
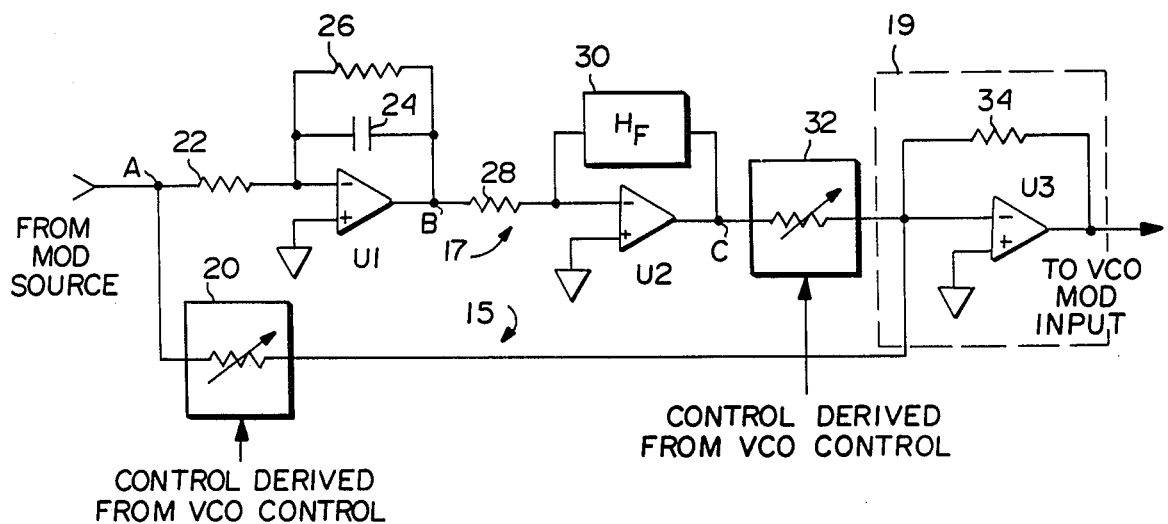
FIG. 2 is an network in accordance with an exemplary embodiment of the present invention which is interposed between a modulation source and the VCO.

FIG. 2 is an exemplary network in accordance with the present invention which is interposed between a modulation source and a modulation receiving input of the VCO 10. The network includes a bottom branch 15, a top branch 17 and a combining or summing stage 19. In the bottom branch 15, signals from the modulation source (not shown) directly drive, via variable gain element 20, operational amplifier U3 which forms the branch coupling or summing stage 19. The output of U3 is directly tied to the VCO modulation input. Exemplary variable gain networks 20 are described in detail below in conjunction with FIGS. 4–6.

Thus, the modulation input attenuated by variable resistor element 20 is tied directly to the VCO modulation input via operational amplifier U3. The signals from the modulation source are not processed in this "direct" modulation path (other than being attenuated at 20). The bottom branch 15 may be viewed as the high frequency input to the VCO.

The top branch 17 is coupled in parallel to the bottom branch 15 and serves to compensate for the low frequency cut off of the phase locked loop shown in FIG. 1. Accordingly, the circuitry in the top branch 17 serves to provide a low frequency boost to the modulation input signals.

The network shown in FIG. 2 which is interposed between the source of modulation and the VCO modulation input may be broadly characterized as simulating or providing a replica of the inverse of the phase locked loop frequency characteristic of the phase locked loop shown in FIG. 1. By providing an inverse replica of the frequency characteristic of the control loop to the VCO modulation input, the composite system exhibits a constant or unity gain response thereby resulting in a flat modulation characteristic.

Focusing in more detail on the top branch 17 of the circuit in FIG. 2, the circuitry between nodes A and C associated with operational amplifiers U1 and U2 serve to cut off high frequency signals and boost low frequency signals received from the modulation source. Focusing on operational amplifier U1, due to the feedback capacitor 24, as the frequency increases by a factor of 2, for example, the operational amplifier gain decreases by a factor of 2. Accordingly, for higher frequencies, the operational amplifier U1 has essentially zero gain.

Figure 3:
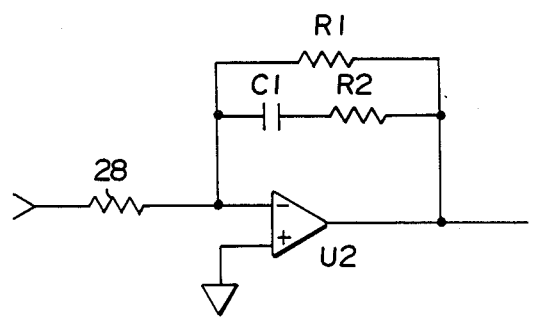
FIG. 3 is an exemplary implementation of the simulated loop filter HF shown in FIG. 2.

Likewise, the stage following operational amplifier U1, associated with operational amplifier U2 also has a high frequency cut off due to feedback element 30 (which is described below in conjunction with FIG. 3), which is a replica of loop filter 8, shown in FIG. 1. In combination, the combined effect of the U1 and U2 associated stages between nodes A and C is to cause the modulation input to fall off asymptomatically at 12 db per octave. At a predetermined high frequency the input signal along the top branch 17 is insignificant when compared to the essentially direct input via the bottom branch 15.

With respect to low frequencies, the top branch 17 introduces a low frequency boost to correct for the cut off of low frequencies in the phase locked loop shown in FIG. 1. In the phase locked loop, as the frequency decreases, the gain of the closed locked loop increases. This phenomenon decreases the ability to modulate the VCO. Thus, as the loop gain increases at lower frequencies, the modulation input provided by the circuit in the top branch 17 must also be increased in gain in order to compensate for the inherent operation of the phase locked loop.

As will be explained in further detail below, components 20 and 32 under the control of a control signal received, for example, from the VCO serves to insure that the relative contribution of signals received over paths 15 and 17 are appropriate to achieve the desired wideband modulation. Thus, the two inputs that are being summed by operational amplifier U3 should have the proper ratio as to amplitude and phase to insure that the signals being summed provide a constant modulation input.

Focusing on the specific circuitry associated with operational amplifier U1 between nodes A and B, this network provides the amount of gain required to generate the low frequency asymptote needed to compensate for the increase in gain of the phase locked control loop shown in FIG. 1. As noted above, the phase locked loop in FIG. 1 has a low frequency asymptote, determined by the loop filter 8 and the phase detector characteristics 6. The phase detector is a network which exhibits an increase in gain which is inversely proportional to frequency (K/S). Thus, at low frequencies the gain of the phase detector is high.

The loop filter 8 serves to eliminate noise from the phase detector 6 and filters out unwanted high frequency components. The loop filter 8 exhibits no loss at low frequencies, while showing substantial loss at high frequencies.

The overall characteristic of the phase locked loop shown in FIG. 1 is to considerably boost low frequency components. As the phase locked loop increases in gain, for low frequency components, the top branch 17, likewise increases the gain of the modulation input to insure that such components are not nullified by the operation of the phase locked loop.

Turning now to the specific component operation in FIG. 2, the modulation input is input to the inverting input of operational amplifier U1 via resistor 22. Operational amplifier U1 outputs a signal that is fed back to its inverting input U1 via a parallel RC feedback circuit 24, 26. U1 operates such that the current input to its inverting input is essentially zero. The non-inverting input of operational amplifier U1 is grounded. The feedback current from operational amplifier U1 is essentially all fed back to the inverting input via capacitor 24. Resistor 26, which is coupled in parallel with capacitor 24 serves to keep U1 stable at low frequencies.

In operation, the output voltage of operational amplifier U1 drops with an associated rise in frequency of the input signal at a 6 db per octave ratio. Thus, when the input frequency goes up by a factor of two, the output voltage drops by a factor of 2. If only capacitor 24 were present in the feedback loop, the output voltage would have a constant 6 db per octave slope that would essentially go to infinity at low frequency. The presence of the resistor 26, as noted above, provides for a stable operation at such low frequencies. Operational amplifier U1 and the associated feedback RC circuit operate as an integrator compensating for the low frequency gain in the phase locked loop corresponding to the gain provided by the phase detector 6.

A second integration stage is provide between circuit nodes B and C of the top branch of FIG. 2 to compensate for the low frequency increases in gain in the phase locked loop due to the loop filter 8. In operation, the voltage out of operational amplifier U1 divided by resistor 28 is equal in magnitude but opposite in sign to the current out of component $H_F$ which is labelled 30 in FIG. 2. The non-inverting input of U2 is grounded.

Figure 4:
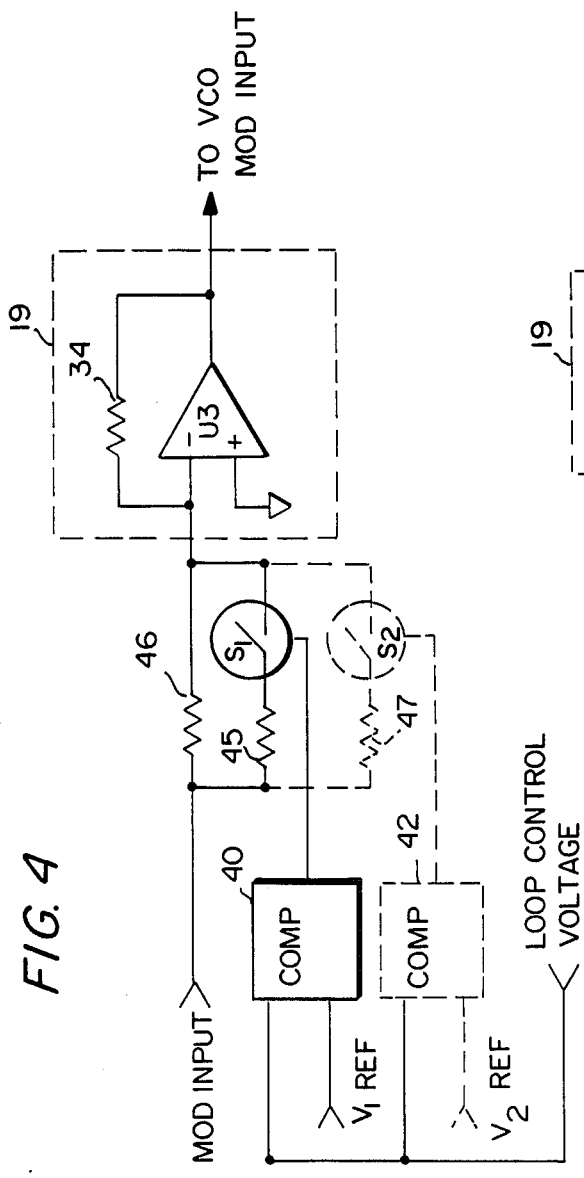

The output characteristic of the second integration stage varies proportionally with $1/H_F$, where $H_F$ is a simulation of the loop filter 8 shown in FIG. 1. The loop filter 8 has a loop filter response which is typically of the lag type. This lag filter response $H_F$ can be realized in the arrangement shown in FIG. 3, which shows a simulated loop filter comprised of an RC network in combination with resistor 28 and operational amplifier U2 as shown in FIG. 2. It can be shown that the loop filter transfer function $H_F$ is equal to $$H_F = -\frac{R1}{R28} \cdot \frac{1 + sR2 \cdot C1}{1 + s(R1 + R2)C1}$$

where s is related to frequency (jw). Thus, the loop filter 8 may be simulated as shown in FIG. 4 by an RC network coupled from the output of U2 to the inverting input of U2. The RC network includes a series RC circuit consisting of R2 and C1 in parallel with resistor R1.

As noted above, the cascaded stages associated with operational amplifier U1 and U2 together simulate the phase detector 6 and loop filter 8, respectively. Turning back to FIG. 2, as the frequency of the modulation input signal decreases, the output resulting from these two stages keeps increasing due to these first and second integrating stages. Accordingly, the inverting input of the summing stage operational amplifier U3 receives input signals which reflect two significant gain variable elements of the phase locked loop (i.e., phase detector 6 and loop filter 8).

When a phase locked loop synthesizer is operated over its range of output frequencies, some loop parameters may change. Although there are certainly applications for which no such compensation is required, there are likewise applications in which compensation for loop parameter changes should take place. For example, for low speed digital modulation systems, compensation should be made for loop parameter changes.

It is noted that the need to compensate for loop parameter changes typically becomes greater as the frequencies that need to be transmitted through the loop become lower. Typically, compensation would be required if, for example, tone modulation is being employed using frequencies below the audio range e.g., 300 Hz or below.

In a digital modulation system, where frequencies are utilized on the order of 5 to 10 Hz, significant pulse distortion will result unless compensation is introduced via, for example, variable gain elements 20 and 32 shown in FIG. 2. Such a digital modulation system is significantly more sensitive to changes in loop parameters than a tone modulation system, which typically can tolerate such parameter changes.

When a phase locked loop synthesizer is operated over its range of output frequencies, both the countdown ratio, M, and the voltage control oscillator gain factor $K_{vco}$ are likely to change at certain predetermined frequencies. Typically, if the frequency division ratio M is high, the VCO frequency will be high as well and $K_{vco}$ is likely to be reduced causing a tilt in the frequency response.

The circuitry shown in FIG. 2 synthesizes the following transfer function:

$$K_s = \frac{1}{K_{vco}} + \frac{K\phi \cdot H_F}{s \cdot M}$$

where $K_{vco}$ is the VCO control gain, $K_\phi$ is the gain associated with the phase detector, HF is the transfer function of the loop filter 8, s is a frequency proportional factor (jw) and M is the countdown ratio provided by frequency divider 14.

Under such circumstances, the first term, the high frequency equalization component, needs to change as $1/K_{vco}$, while the low frequency component varies inversely proportional to the division ratio M. The change in M is usually less than ±10% for typical mobile radio applications. The relative change in the VCO control gain depends on the VCO design. Variations of 6 db are not uncommon across the tuning range.

One way to compensate for these parameter changes is to incorporate variable gain networks 20 and 32 at the outputs of the respective branches into the summing stage as shown in FIG. 2. Network 20 corrects for the change in $K_{vco}$, network 32 for the change in the division ratio M. These networks can be controlled by the control voltage applied to the VCO. In this regard, the VCO control voltage determines the frequency output from the VCO.

As the VCO changes its frequency and changes its gain, the VCO control voltage likewise changes. Variable gain network 20 may be designed to be responsive to changes in the control voltage, such that when a predetermined threshold is reached, the amount by which input signals are attenuated at element 20 is varied.

Similarly, compensation for changes in the division ratio M may be made by modifying the relative compensation of the top branch 17 by varying the effective resistance of variable resistance network 20. Such compensation is only necessary if the relative change in the division ratio M is substantial.

Turning back to FIG. 1 and focusing on VCO 10, it is noted that the VCO has two inputs, namely an input from the loop filter 8 defining the VCO control voltage and the modulation input $M_{in}$. The gain of the VCO, $K_{vco}$, which is associated with the control input of the VCO typically results in increases in output frequency with applied voltage of a predetermined number of megahertz per volt (e.g., 5 MHz per volt or 5 KHz per millivolt). Thus, it can be seen that the control input of the VCO is extremely sensitive to extraneous signals.

While the modulation input likewise has a modulation gain $K_{mod}$ associated with it, the modulation gain is nowhere near the control gain of 5 MHz per volt. In this regard, it is noted that 5 kHz is a typical deviation used in a frequency modulation system. Thus, typically when a VCO is modulated, a separate input port is utilized which does not modify the VCO output as radically as the control input. For example, the control gain $K_{mod}$ of the modulation input may be 10 KHz per volt. Nevertheless, it should be understood that while a separate modulation input is shown at VCO 10, the modulation input may be input to the VCO 10 at the control input by appropriately combining the output from loop filter 8 with the modulation input provided by the circuit of FIG. 2 (taking into account the gain factors to be associated with each of the signals to be combined).

It is further noted, that in certain conventional VCO's, the modulation may be applied to the ground return of the VCO frequency control element. In such a case, the control and modulation gain will be the same. Ordinarily, however, the modulation input will be separate from the control input such as shown in FIG. 1. In such a case $K_{mod}$ will equal p times $K_{VCO}$, where the gain ratio p is likely to depend on the VCO operating frequency.

Since the gain ratio p is equal to $K_{mod}/K_{VCO}$, if the gain ratio p is not constant, it may then be necessary to modify, for example, the control signal input to block 32 to make up for the changes in p. In this fashion, the effect of changes in gain ratio which effect the low frequency compensation may be compensated for.

If a separate modulation input to the VCO is employed, the equalizer transfer function equation becomes:

$$K_s' = \frac{1}{K_{mod}} + \frac{K\phi \cdot H_F}{s \cdot M \cdot p}, \text{ where } p = \frac{Kmod}{Kvco}$$

Thus, as noted above, if the gain ratio p varies with frequency, then the control signal applied to element 32 in FIG. 2 must be accordingly varied so that the transfer function $K_s'$ is accurately synthesized by the circuitry of FIG. 2 to thereby compensate for any changes in the gain ratio.

It is noted that the amount of relative contributions of the signals received over paths 15 and 17 depends on the nature of the modulation source. For example, if the source is a sinusoidal tone frequency, exemplary circuits for supplying a proper ratio for either of the components 32 or 20 are shown below in FIGS. 4, 5 and 6. If the modulation source is a data waveform with significant energy at low frequencies the accuracy requirements for the relative contribution of the top and bottom branches is more critical than for tone modulation. As will be appreciated by those skilled in the art, the exemplary networks shown in FIGS. 4, 5 and 6, may be used as variable gain elements 20 or 32, with only the threshold voltages changing to achieve the desired compensation. For further details regarding compensating for changes in loop parameters over the VCO tuning range, reference is made to the applicant's copending application filed concurrently herewith entitled "Phase Locked Frequency Synthesizer With Single Input Gain Compensated Wideband Modulation System", Ser. No. 244,399, which application is hereby incorporated by reference herein.

Figure 5:
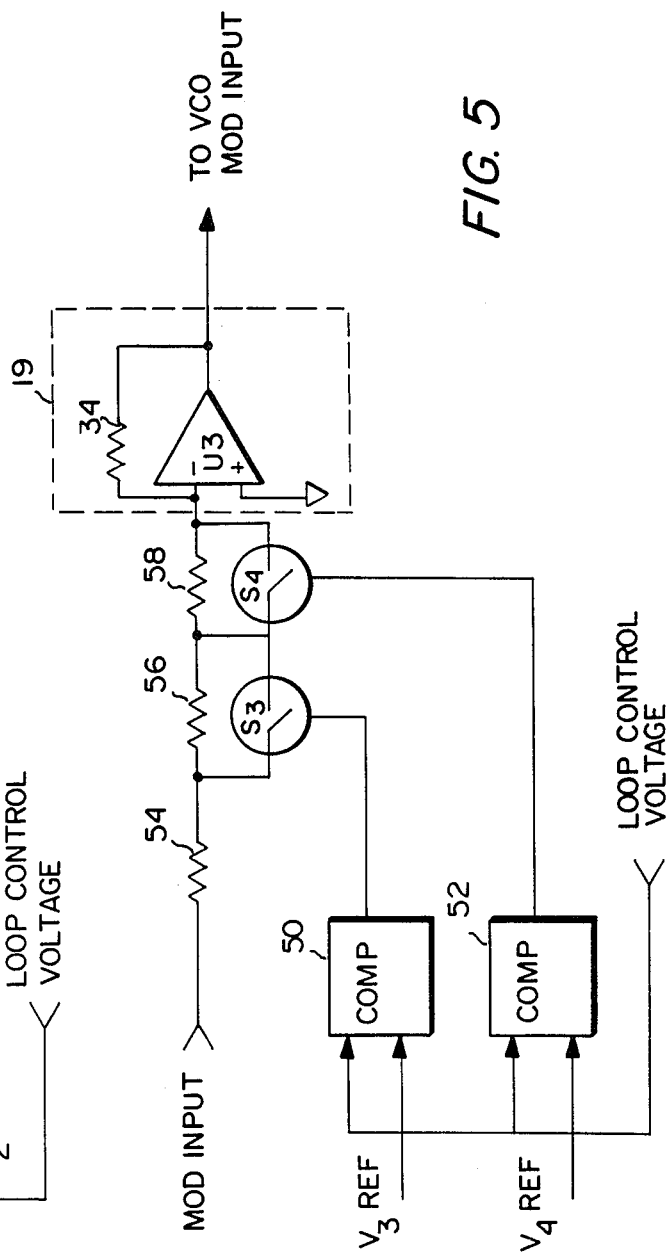

In FIGS. 4, 5 and 6 summing stage 19 operates as will be described below in conjunction with FIG. 2 and will not be described herein. Referring to FIG. 4, the objective is to change the gain of the summing stage 19 with respect to the modulation input signal received, for example, from the output of operational amplifier U2 from FIG. 2 (presuming variable gain element 32 is being implemented). The gain is essentially proportional to the current fed into the inverting input of the Op Amp U3, or inversely proportional to the resistance of the input circuit. The modulation input signal is coupled to the inverting input of operational amplifier U3 via resistor 46. Comparator 40 compares the FIG. 1 loop control voltage (i.e., the control input to keep the VCO on the correct frequency) with a DC reference ($V_1$ Ref). If the control voltage input exceeds the reference, the comparator 40 changes state and provides a control output to change the state of switch $S_1$ (either turning it on or off as the situation requires).

Switch $S_1$ shunts resistor 45 across resistor 46, thus increasing the Op Amp U3 gain with respect to this input. To get more accurate gain shaping, a multiplicity of comparators with, of course, different comparison levels, can be used. For example, as shown in dashed lines, a comparator 42 having an associated reference voltage $V_2$ REF may be used to switch resistor 47 in parallel with resistors 45 and 46 via switch $S_2$.

As will be appreciated by those skilled in the art, the switching arrangement shown in FIG. 4 may be modified as shown in FIG. 5 to use a series arrangement of resistors 54, 56 and 58, where resistors 56 and 58 are controllably short circuited under the control of comparators 50 and 52, respectively, which compare the loop control voltage with their respective reference voltages $V_3$ REF and $V_4$ REF.

Turning to FIG. 6, instead of using the loop control voltage, it is possible to directly use the transceiver microcontroller 60 that programs the synthesizer 62 to control the gain control circuitry, depending on the channel (frequency) information. In this regard, since transceiver microcontroller 60 is programmed in accordance with the desired characteristics of the phase locked loop frequency synthesizer 62 and otherwise controls the synthesizer 62, the microcontroller 60 may directly be used to control switches S10–S40 (instead of using the loop control voltage).

The output ports of the microcontroller 60 can directly control the switches S10, S20, S30 and S40, or else as shown in FIG. 6, a switch select or decode logic circuit 64 can be employed. This is more economical if more than two switches are used since two ports can control four switches, three ports can control eight switches, etc.

As shown in FIG. 6, two microcontroller output ports are used to control the four switches S10, S20, S30 and S40 which are respectively coupled in series with resistors 68, 70, 72 and 74. The modulation input is coupled to the inverting input of operational amplifier U3 via resistor 66. As additional resistors are coupled in parallel to resistor 66, the gain of Op Amp U3 increases as described above with respect to FIG. 4.

Further, it is noted that field effect transistors may be used as a gain control element. In such an implementation, instead of a comparator switch arrangement, the control voltage is applied via a DC offset arrangement to bias a field effect transistor on or off, shunting the channel resistance of the transistor across one or more resistors to limit the resistance range. Again, a multiplicity of switches can be used for more accurate control. This technique, although less accurate, may provide more gradual gain control.

Turning back to FIG. 2, focusing on the output summing stage 19, the summing stage sums the signals received over the direct path 15 with the signals on path 17. Operational amplifier U3 serves to sum these two signals. Alternatively, signals transmitted along these paths could have been resistively combined and input to the modulation input of the VCO 10. Like operational amplifiers U1 and U2, operational amplifier U3 has its non-inverting input grounded.

In operation, like operational amplifiers U1 and U3, U3 functions to maintain the voltage at its inverting input at essentially zero volts. If a summing stage were utilized which operated in a different fashion, then the output signal from operational amplifier U3, which is fed back via resistor 34, would also be fed back through network 20 to the modulation source, thereby resulting in potentially unstable operation. Use of operational amplifier U3 and feedback resistor 34 obviates this problem. Furthermore, since the operational amplifier stages U1 and U2 boost the low frequency components, the extra summing stage can minimize possible overload problems. Additionally, as noted above, operational amplifier U3 also serves to minimize overall feedback around the circuit which would cause low frequency instability of the source impedance of the modulation is too high.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

I claim:

1. Apparatus for modulating a phase-locked loop including a voltage controlled oscillator having an input for receiving a modulation signal from a modulation source, said apparatus comprising:

first means, coupled to said modulation source, for coupling at least high frequency signals from said modulation source to said input of said voltage controlled oscillator;

second means, coupled to said modulation source, for blocking high frequency signals and for boosting low frequency signals received from said modulation source; and means for summing signals from said first means and second means to provide a compensated modulation signal to said input of said voltage controlled oscillator.

2. Apparatus according to claim 1, wherein said first means includes amplitude control means for providing high frequency signals of the appropriate amplitude to said means for summing.

3. Apparatus according to claim 2, wherein said amplitude control means directly couples signals from said modulation source to said means for summing via a variable gain means.

4. Apparatus according to claim 1, wherein said second means includes means for compensating for the low frequency increases in gain in said phased-locked loop by correspondingly increasing the gain of said low frequency signals received from said modulation source.

5. Apparatus according to claim 4, wherein said phase-locked loop includes a phase detector and a loop filter and wherein said means for compensating includes a first integration means for compensating for the operation of the phase locked loop phase detector and a second integration means for compensation for the operation of the phase locked loop filter.

6. Apparatus according to claim 1, further including means coupled to said second means, for compensating for changes in the phase locked loop gain due to changes in the gain of the voltage controlled oscillator.

7. Apparatus according to claim 6 wherein said means for compensating includes variable gain means responsive to the control voltage applied to said voltage controlled oscillator for modifying the amplitude of signals input thereto.

8. Apparatus according to claim 1, wherein said means for summing includes an operational amplifier.

9. Apparatus according to claim 8, wherein said first and second means are coupled to the inverting input of said operational amplifier and wherein the non-inverting input of said operational amplifier is grounded.

10. Apparatus according to claim 1, wherein said first means includes means for compensating for changes in at least one phase locked loop parameter.

11. Apparatus for modulating a phase locked loop including a voltage controlled oscillator having an input for receiving modulation signals from a modulation source, said apparatus comprising:

means coupled to said modulation source for receiving modulation signals from said modulation source; and means, coupled to said means for receiving, for providing an inverse replica of the frequency characteristic of the phase locked loop to said voltage controlled oscillator input to thereby provide wideband modulation of said phase locked loop.

12. Apparatus according to claim 11, wherein said means for providing an inverse replica includes:

first means, coupled to said means for receiving, for coupling high frequency signals to said input of said voltage controlled oscillator;

second means coupled to said means for receiving, for boosting low frequency signals received from said modulation source; and means for coupling signals generated by said first and second means to said input of said voltage controlled oscillator.

13. Apparatus according to claim 12, wherein said first means includes amplitude control means for providing high frequency signals of a predetermined amplitude to said input of said voltage controlled oscillator for receiving a modulation signal.

14. Apparatus according to claim 13, wherein said amplitude control means directly couples signals from said modulation source to said means for coupling via a variable attenuating means.

15. Apparatus according to claim 12, wherein said second means include means for compensating for the low frequency increases in gain in said phase locked loop by correspondingly increasing the gain of said low frequency signals received from said modulation source.

16. Apparatus according to claim 15, wherein said phase locked loop includes a phase detector and a loop filter and wherein said means for compensating includes a first integration means for compensating for the phase locked loop phase detector increases in gain and a second integration means for compensation for the phase locked loop filter increases in gain.

17. Apparatus according to claim 12, further including means coupled to said second means for compensating for changes in the phase locked loop gain due to changes in the gain of the voltage controlled oscillator.

18. Apparatus according to claim 17, wherein said means for compensating includes variable gain means responsive to the control voltage applied to said voltage controlled oscillator for modifying the amplitude of signals input thereto.

19. Apparatus according to claim 12, wherein said means for coupling includes summing means comprising an operational amplifier.

20. Apparatus according to claim 19, wherein said first and second means are coupled to the inverting input of said operational amplifier and wherein the non-inverting input of said operational amplifier is grounded.

21. Apparatus according to claim 12, wherein said first means includes means for compensating for changes in at least one phase locked loop parameter.

22. Apparatus according to claim 21, wherein said phase locked loop includes at least one frequency divider, and wherein said parameter is the countdown ratio of said at least one frequency divider.

23. A method for wideband modulating a phase locked loop having a predetermined frequency characteristic including a voltage controlled oscillator having an input for receiving modulation signals, said method comprising the steps of:

providing modulation signals from a modulation source;

generating, by processing said modulation signals, an inverse replica of the frequency characteristic of the phase locked loop; and coupling said inverse replica to said input of said voltage controlled oscillator to thereby provide wideband modulation of said phase locked loop.

24. A method according to claim 23, wherein said generating an inverse replica step includes the step of:

coupling high frequency signals received from said modulation source to said input of said voltage controlled oscillator; and boosting low frequency signals received from said modulation source.

25. A method according to claim 24, wherein said step of coupling high frequency signals includes the step of providing high frequency signals of a predetermined amplitude to said input of said voltage controlled oscillator for receiving modulation signals.

26. A method according to claim 24, wherein said boosting step include the step of compensating for the low frequency increases in gain in said phase locked loop by correspondingly increasing the gain of said low frequency signals received from said modulation source.

27. A method according to claim 23, further including the step of compensating for changes in the phase locked loop gain due to changes in the gain of the voltage controlled oscillator.

28. A method according to claim 24, wherein said step of coupling high frequency signals includes the step of compensating for changes in at least one phase locked loop parameter.

29. A method according to claim 28, wherein said phase locked loop includes at least one frequency divider, and wherein said parameter is the countdown ratio of said at least one frequency divider.

* * * * *